US010418777B2

(12) United States Patent
Ho et al.

(10) Patent No.: US 10,418,777 B2
(45) Date of Patent: Sep. 17, 2019

(54) COAXIAL TRANSMITTER OPTICAL SUBASSEMBLY (TOSA) INCLUDING SIDE-BY-SIDE LASER DIODE AND MONITOR PHOTODIODE ARRANGEMENT

(71) Applicant: Applied Optoelectronics, Inc., Sugar Land, TX (US)

(72) Inventors: I-Lung Ho, Sugar Land, TX (US); Qin Li, Houston, TX (US); Chong Wang, Stafford, TX (US); Hao-Hsiang Liao, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 15/591,274

(22) Filed: May 10, 2017

(65) Prior Publication Data

US 2018/0331494 A1   Nov. 15, 2018

(51) Int. Cl.
*H04B 10/00* (2013.01)
*H01S 5/022* (2006.01)
*H01S 5/024* (2006.01)
*H04B 10/50* (2013.01)

(52) U.S. Cl.
CPC ...... *H01S 5/02252* (2013.01); *H01S 5/02469* (2013.01); *H04B 10/503* (2013.01); *H01S 5/02208* (2013.01); *H01S 5/02236* (2013.01); *H01S 5/02276* (2013.01); *H01S 5/02284* (2013.01); *H01S 5/02492* (2013.01)

(58) Field of Classification Search
CPC ............. H01S 5/02252; H01S 5/02469; H01S 5/02288; H01S 5/042; H01S 5/02212; H04B 10/503
See application file for complete search history.

(56) References Cited

U.S. PATENT DOCUMENTS

| 5,194,105 A | 3/1993 | Nguyen | |
|---|---|---|---|
| 5,216,730 A * | 6/1993 | Demeritt | G02B 6/4204 385/33 |
| 6,335,869 B1 * | 1/2002 | Branch | G02B 6/4201 174/367 |
| 6,609,838 B1 * | 8/2003 | Branch | G02B 6/4246 361/752 |

(Continued)

FOREIGN PATENT DOCUMENTS

WO   WO 2016191359 A1 * 12/2016 ............. H04B 10/40

*Primary Examiner* — Agustin Bello
(74) *Attorney, Agent, or Firm* — Grossman Tucker Perreault & Pfleger, PLLC; Norman S. Kinsella (57) ABSTRACT

A coaxial transmitter optical subassembly (TOSA) including a side-by-side laser diode and monitor photodiode package, consistent with embodiments of the present disclosure, may be used in an optical transceiver for transmitting an optical signal at a channel wavelength. In an embodiment, the coaxial TOSA includes a laser sub-mount coupled to a mounting region defined by a body of the coaxial TOSA. The laser sub-mount includes a monitor photodiode disposed adjacent to a side of a laser diode such that a sensor region of the monitor photodiode is disposed within, or in close proximity to, a light cone emitted by a light emitting surface of the laser diode. The monitor photodiode is thus configured to directly receive a portion of emitted channel wavelengths from the laser diode for monitoring purposes.

20 Claims, 5 Drawing Sheets

(56) References Cited

U.S. PATENT DOCUMENTS

| | | | | |
|---|---|---|---|---|
| 8,559,824 B2* | 10/2013 | McColloch | ......... | G02B 6/4246 |
| | | | | 372/38.02 |
| 9,614,620 B2* | 4/2017 | Ho | ......... | H04B 10/40 |
| 9,804,352 B2* | 10/2017 | Yeh | ......... | G02B 6/4292 |
| 9,876,576 B2* | 1/2018 | Ho | ......... | H04B 10/40 |
| 2005/0189473 A1* | 9/2005 | Schrodinger | ......... | H01L 31/147 |
| | | | | 250/214.1 |
| 2007/0278666 A1* | 12/2007 | Garcia | ......... | G02B 6/4202 |
| | | | | 257/707 |
| 2009/0116838 A1* | 5/2009 | Kihara | ......... | G02B 6/4208 |
| | | | | 398/79 |
| 2011/0164848 A1 | 7/2011 | Bolle | | |
| 2015/0256261 A1* | 9/2015 | Ho | ......... | G02B 6/43 |
| | | | | 398/139 |
| 2016/0231581 A1* | 8/2016 | Liu | ......... | G02B 27/283 |
| 2017/0269311 A1* | 9/2017 | Wang | ......... | G02B 6/4208 |
| 2017/0269313 A1* | 9/2017 | Luo | ......... | G02B 6/4244 |
| 2017/0269315 A1* | 9/2017 | Yeh | ......... | G02B 6/12019 |
| 2017/0272169 A1* | 9/2017 | Ho | ......... | H04B 10/40 |

* cited by examiner

FIG. 5

# COAXIAL TRANSMITTER OPTICAL SUBASSEMBLY (TOSA) INCLUDING SIDE-BY-SIDE LASER DIODE AND MONITOR PHOTODIODE ARRANGEMENT

TECHNICAL FIELD

The present disclosure relates to optical transmitters and transceivers, and more particularly, to a coaxial transmitter optical subassembly (TOSA) including a side-by-side laser diode and monitor photodiode package for use in an optical transmitter or transceiver.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher' speeds in smaller optical transceiver modules for a lower cost has presented challenges, for example, with respect to thermal management, insertion loss, and manufacturing yield.

Optical transceiver modules generally include one or more transmitter optical subassemblies (TOSAs) for transmitting optical signals. A TOSA generally includes a laser package for housing a laser diode and a lens optically coupling the laser diode to an optical fiber. In at least one type of TOSA, an aspherical lens is used to provide a relatively high coupling efficiency and the aspherical lens has a square perimeter shape to fit within the laser package. These lenses, however, are often more expensive. Moreover, a lower power output may be desired in some applications without having to redesign the TOSA with a different laser. Thus, the higher coupling efficiency of the aspherical, square lenses may provide a power output that is too high and at a cost that is too high. The design and space restrictions within a TOSA also present challenges with respect to using different lenses.

BRIEF DESCRIPTION OF THE DRAWINGS

These and other features and advantages will be better understood by reading the following detailed description, taken together with the drawings wherein.

DETAILED DESCRIPTION

A coaxial transmitter optical subassembly (TOSA) including a side-by-side laser diode and monitor photodiode arrangement, consistent with embodiments of the present disclosure, may be used in an optical transceiver for transmitting an optical signal at a channel wavelength. In an embodiment, the coaxial TOSA includes a laser sub-mount coupled to a mounting region defined by a body of the coaxial TOSA. The laser sub-mount includes a monitor photodiode disposed adjacent to a side of a laser diode such that a sensor region of the monitor photodiode is disposed within, or in close proximity to, a light beam emitted by light emitting surface of the laser diode. The monitor photodiode is thus configured to directly receive a portion of emitted channel wavelengths from the laser diode for monitoring purposes. The position of the monitor photodiode in the side-by-side arrangement also allows for a laser diode driver (LDD) to be disposed in close proximity with the laser diode, e.g., proximate to a surface of the laser diode opposite of the light emitting surface. Therefore, and in an embodiment, the LDD may directly electrically couple to the laser diode, e.g., via wire bonding, by virtue of the close spacing. The direct coupling of the LDD and laser diode in turn may allow the coaxial TOSA to operate at transmission speeds of up to 25 gigabits per second (Gbps), or more. Direct coupling (or direct electrical coupling), as referred to herein, generally refers to a coupling between components that measures 10 to 100 µm, for example, and that is substantially straight (e.g., without bends) and does not require an intermediate device such as a flexible printed circuit board (FPC). Wire bonding is one example of an interconnect device that may be used in direct electrical coupling. An optical transmitter or transceiver may use N number of coaxial TOSAs, as variously disclosed herein, to achieve multi-channel throughput of, for example, 25 Gbps, 50 Gbps, 100 Gbps or more depending on a desired configuration.

In an embodiment, the coaxial TOSA includes a LDD sub-mount for coupling to the LDD. The LDD sub-mount may be disposed on a separate section of the body from that of the laser sub-mount and may be spaced from the same to provide a gap therebetween. The gap between the LDD sub-mount and the laser sub-mount may be relatively small, e.g., less than 50 µm, to allow for direct electrical coupling between the LDD and the laser diode. The gap may measure other distances and the example measurement is not intended to be limiting. The gap may also provide thermal isolation between the LDD and the laser diode, with each of the LDD and the laser diode having a separate thermal conduction path (or heat dissipation path) through the body of the coaxial TOSA. Accordingly, heat generated by the LDD may not directly conduct onto the laser diode, and vice-versa. Alternatively, or in addition to having a gap between the LDD sub-mount and the laser sub-mount, the laser diode may be disposed on the laser sub-mount at an offset distance D from that of the LDD such that at least a portion of the laser diode is disposed in a horizontal plane which is above an upper surface of the LDD. The offset distance D may be provided by a step/shoulder portion defined by the body of the coaxial TOSA and/or by varying the thickness of the laser sub-mount relative to the LDD sub-mount. In any event, the shoulder portion may provide thermal shielding and advantageously reflect and/or absorb the heat radiated toward the laser diode. Therefore, the laser diode may be at least partially thermally shielded from the LDD to reduce the potential of degraded performance due to heat being transferred by convection or radiation.

In an embodiment, the coaxial TOSA includes a laser package with a ball lens holder section defining a lens holder cavity that receives the ball lens. The lens holder cavity is dimensioned such that the ball lens is positioned in substantial alignment with the laser diode for optically coupling a laser output from the laser diode into an optical waveguide at an optical coupling end of the TOSA. The coaxial TOSA is thus configured to allow the less expensive ball lens to be used in a relatively small package when a lower coupling efficiency and power is desired and without substantial redesign of the TOSA. The laser package may be a cuboid type TO package, and an optical transceiver may include multiple coaxial TOSAs with the cuboid type TO package stacked in a transceiver housing.

As used herein, a "ball lens" is a lens having a substantially spherical outer shape but is not required to be a perfect sphere. As used herein, a "cuboid type TO package" refers to a laser package structure having a generally cuboid or parallelepiped outer shape formed by at least three substantially flat and orthogonal outer surfaces. For clarification, the term "TO" or "transistor outline" is derived from a reference to the traditional cylindrical package or "can" that historically encased a transistor, but as used herein, is otherwise unrelated to such transistor package. As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

As used herein, "thermally coupled" refers to a direct or indirect connection or contact between two components resulting in heat being conducted from one component to the other component and "thermally isolated" refers to an arrangement where heat is prevented from being conducted to the isolated component from an external environment. In a thermally isolated multi-channel TOSA, for example, heat external to the TOSA is prevented from being conducted to one or more components in the TOSA. As used herein, "thermally shielded" refers to an arrangement that prevents heat from being transferred by convection or radiation to the shielded component. Thermally isolated and thermally shielded do not necessarily require an arrangement to prevent all heat from being conducted or transferred.

Example Transceiver Systems

Figure 1A:
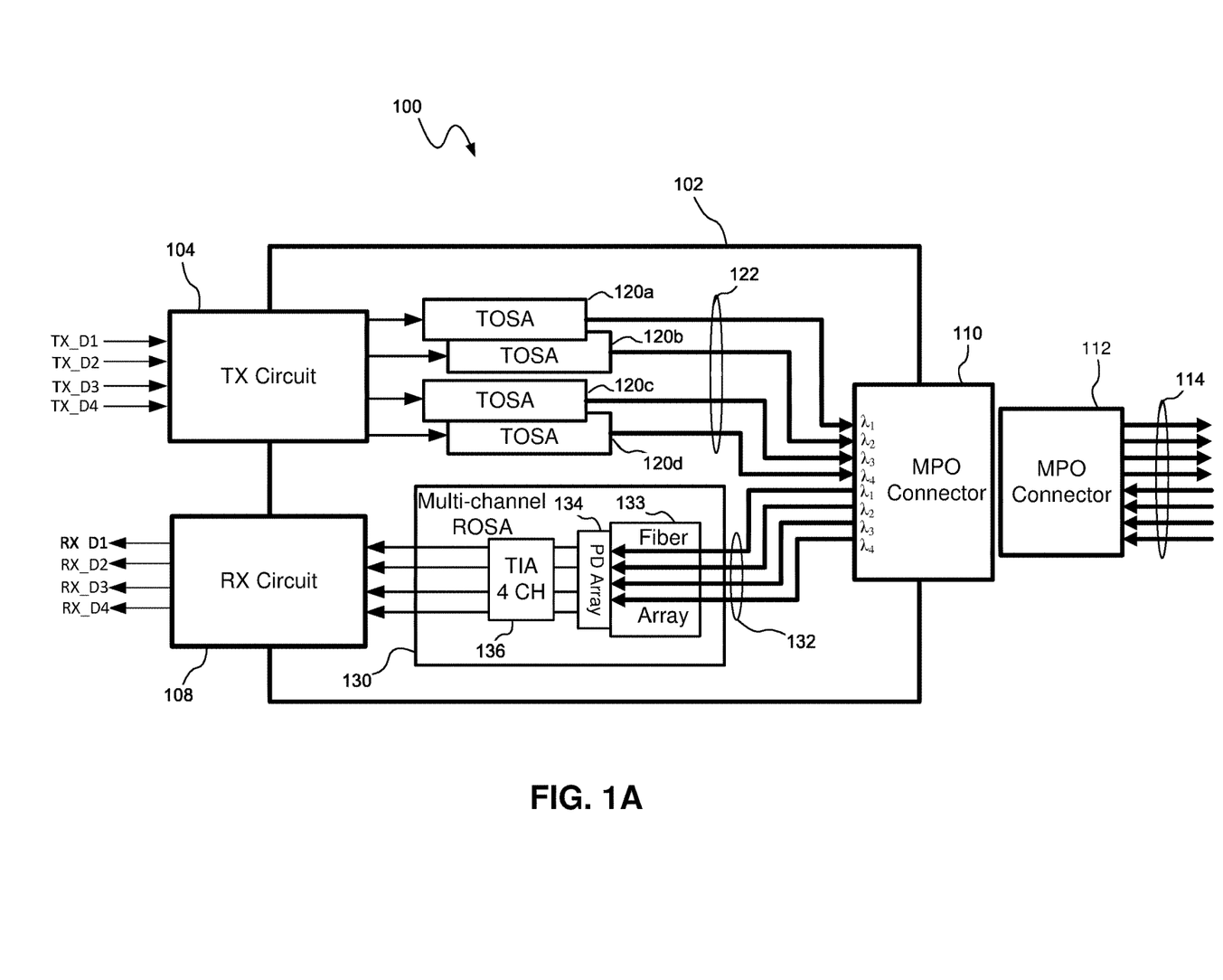
FIGS. 1A and 1B are block diagrams of multi-channel optical transceivers, consistent with embodiments of the present disclosure.

Referring to FIG. 1A, an optical transceiver 100, consistent with embodiments of the present disclosure, is shown and described. In this embodiment, the optical transceiver 100 transmits and receives four (4) channels using four different channel wavelengths ($\lambda 1$, $\lambda 2$, $\lambda 3$, $\lambda 4$) and may be capable of transmission rates of at least about 25 Gbps per channel. In one example, the channel wavelengths $\lambda 1$, $\lambda 2$, $\lambda 3$, $\lambda 4$ may be 1270 nm, 1290 nm, 1080 nm, and 1330 nm, respectively. The optical transceiver 100 may also be capable of transmission distances of 2 km to at least about 10 km. The optical transceiver 100 may be used, for example, in internet data center applications or fiber to the home (FTTH) applications.

This embodiment of the optical transceiver 100 includes multiple transmitter optical subassemblies (TOSAs) 120a-d for transmitting optical signals on different channel wavelengths and a multi-channel receiver optical subassembly (ROSA) 130 for receiving optical signals on different channel wavelengths. The TOSAs 120a-d and the multi-channel ROSA 130 are located in a transceiver housing 102. A transmit connecting circuit 104 and a receive connecting circuit 108 provide electrical connections to the TOSAs 120a-d and the multi-channel ROSA 130, respectively, within the housing 102. The transmit connecting circuit 104 is electrically connected to the electronic components (e.g., the laser, monitor photodiode, etc.) in each of the TOSAs 120a-d and the receive connecting circuit 108 is electrically connected to the electronic components (e.g., the photodiodes, the TIA, etc.) in the multi-channel ROSA 130. The transmit connecting circuit 104 and the receive connecting circuit 108 may be flexible printed circuits (FPCs) including at least conductive paths to provide electrical connections and may also include additional circuitry.

A multi-fiber push on (MPO) connector 110 provides optical connections to the TOSAs 120a-d and the multi-channel ROSA 130 within the housing 102. The MPO connector 110 is optically coupled to the TOSAs 120a-d and the multi-channel ROSA 130 via transmit optical fibers 122 and receive optical fibers 132, respectively. The MPO connector 110 is configured to be coupled to a mating MPO connector 112 such that the optical fibers 122, 132 in the optical transceiver 100 are optically coupled to external optical fibers 114.

Each of the TOSAs 120a-d may be a coaxial TOSA with a coaxial configuration electrically connected at one end to conductive paths on the transmit connecting circuit 104 and optically coupled at the other end to a respective one of the optical fibers 122. Each of the TOSAs 120a-d may include a laser for generating laser light at the assigned channel wavelength and a monitor photodiode package disposed next to and forward of a light emitting surface of the laser diode to monitor light emitted by the lasers, as will be described in greater detail below. Each of the TOSAs 120a-d may further include a ball lens for coupling the laser light into the respective optical fiber 122. The lasers in the TOSAs 120a-d thus convert electrical data signals (TX_D1 to TX_D4) received via the transmit connecting circuit 104 into modulated optical signals transmitted over transmit optical fibers 122. The lasers may include, for example, distributed feedback (DFB) lasers with diffraction gratings. Each of the TOSAs 120a-d may further include a laser diode driver (LDD) disposed adjacent an associated laser diode for driving the same. The LDD may be mounted on a first sub-mount, which may also be referred to as an LDD sub-mount, and the laser diode may be mounted on a second sub-mount, which may also be referred to as a laser sub-mount, with the first sub-mount being different from the second sub-mount. The laser sub-mount may be offset relative to the LDD sub-mount to form a gap therebetween. This may advantageously provide separate paths for heat to conduct through the body of each TOSA structure in order to minimize or otherwise reduce heat generated by the laser diode from interfering with operation of the LDD and vice-versa. Thus, the separated first and second sub-mounts allow their respective LDD and laser diode to be thermally isolated from each other such that each does not directly thermally conduct onto the other.

As discussed in greater detail below, the gap between the LDD sub-mount and the laser sub-mount may be continuous or non-continuous and may measure tens of microns ($\mu m$), e.g., 10 to 100 $\mu m$, depending on a desired configuration. This relative small gap may advantageously allow for direct coupling of a laser diode to an associated LDD while also providing thermal isolation. One example of direct coupling device includes wire bonding, although other approaches to direct electrical interconnection of components is within the scope of this disclosure. Each of the TOSAs 120a-d may further include one or more temperature control devices, such as a resistive heater and/or a thermoelectric cooler (TEC), for controlling a temperature of the lasers, for example, to control or stabilize the laser wavelengths.

This embodiment of the multi-channel ROSA 130 includes a photodetector array 134 including, for example, photodiodes optically coupled to a fiber array 133 formed by the ends of the receive optical fibers 132. The multi-channel ROSA 130 also includes a multi-channel transimpedance amplifier 136 electrically connected to the photodetector array 134. The photodetector array 134 and the transimpedance amplifier 136 detect and convert optical signals received from the fiber array 133 into electrical data signals (RX_D1 to RX_D4) that are output via the receive connecting circuit 108. Other embodiments of a ROSA may also be used in the transceiver 100 for receiving and detecting one or more optical signals.

This embodiment of the optical transceiver 100 does not include an optical multiplexer or demultiplexer. The optical signals may be multiplexed and demultiplexed external to the optical transceiver 100.

Figure 1B:
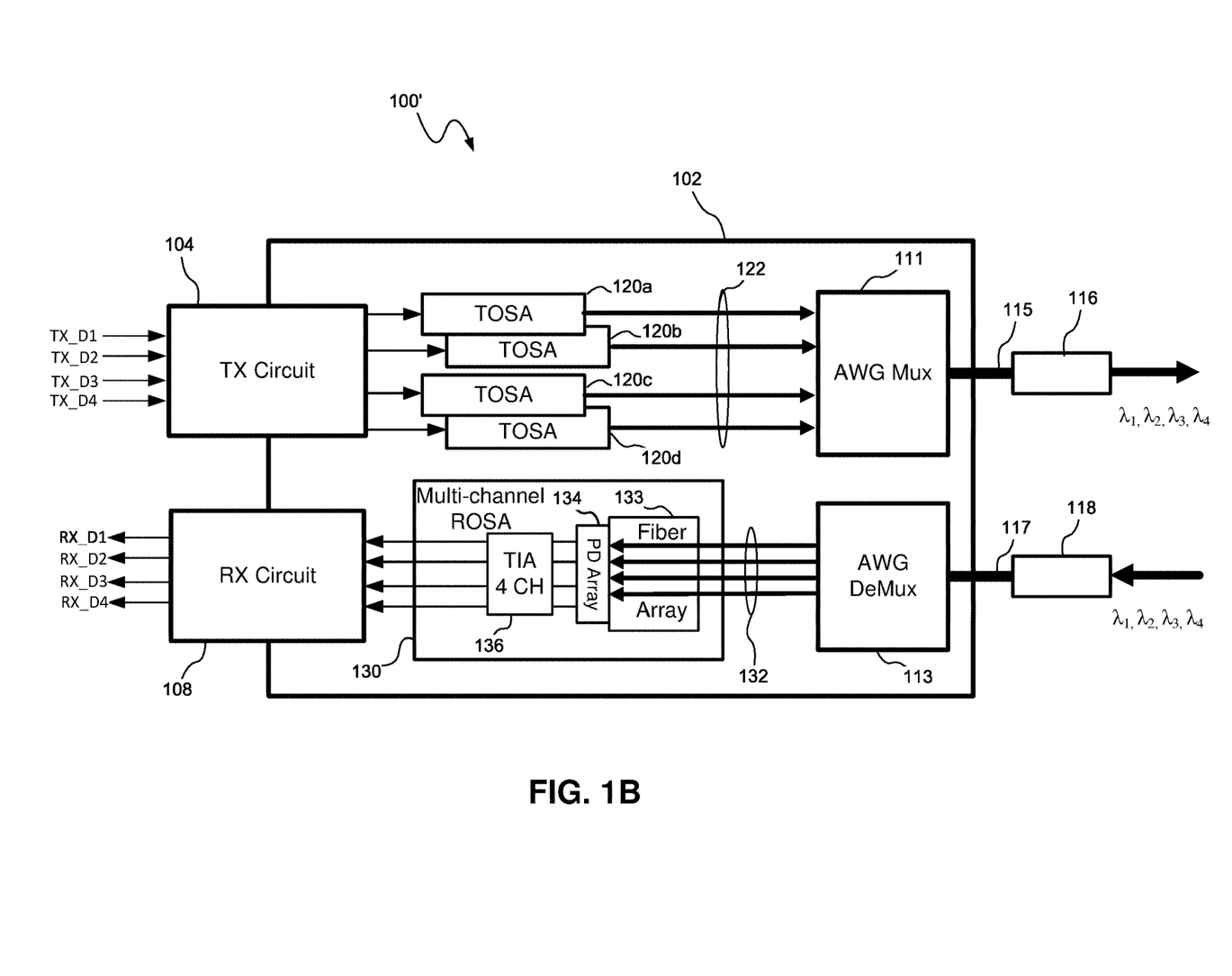

Referring to FIG. 1B, another embodiment of an optical transceiver 100' includes the same light engine (e.g., TOSAs 120a-d and ROSA 130) described above together with an optical multiplexer 111 and an optical demultiplexer 113. The optical multiplexer 111 and the optical demultiplexer 113 both may include arrayed waveguide gratings (AWGs). The optical multiplexer 111 is optically coupled to the transmit optical fibers 122 and the optical demultiplexer 113 is optically coupled to the receive optical fibers 132. The optical multiplexer 111 multiplexes the optical signals being transmitted over transmit optical fibers 122 to provide a multiplexed optical signal on an output optical fiber 115. The optical demultiplexer 113 demultiplexes a multiplexed optical signal received on an input optical fiber 117 to provide received optical signals on receive optical fibers 132. The output optical fiber 115 and the input optical fiber 117 are coupled to an output optical connector 116 and an input optical connector 118, respectively.

This embodiment of the optical transceiver 100' includes 4 channels and may be configured for coarse wavelength division multiplexing (CWDM), although other numbers of channels are possible. This embodiment of the optical transceiver 100' may also be capable of transmission rates of at least about 25 Gbps per channel and transmission distances of 2 km to at least about 10 km and may be used in internet data center applications or fiber to the home (FTTH) applications.

Example Transmitter Optical Subassembly (TOSA)

Figure 2:
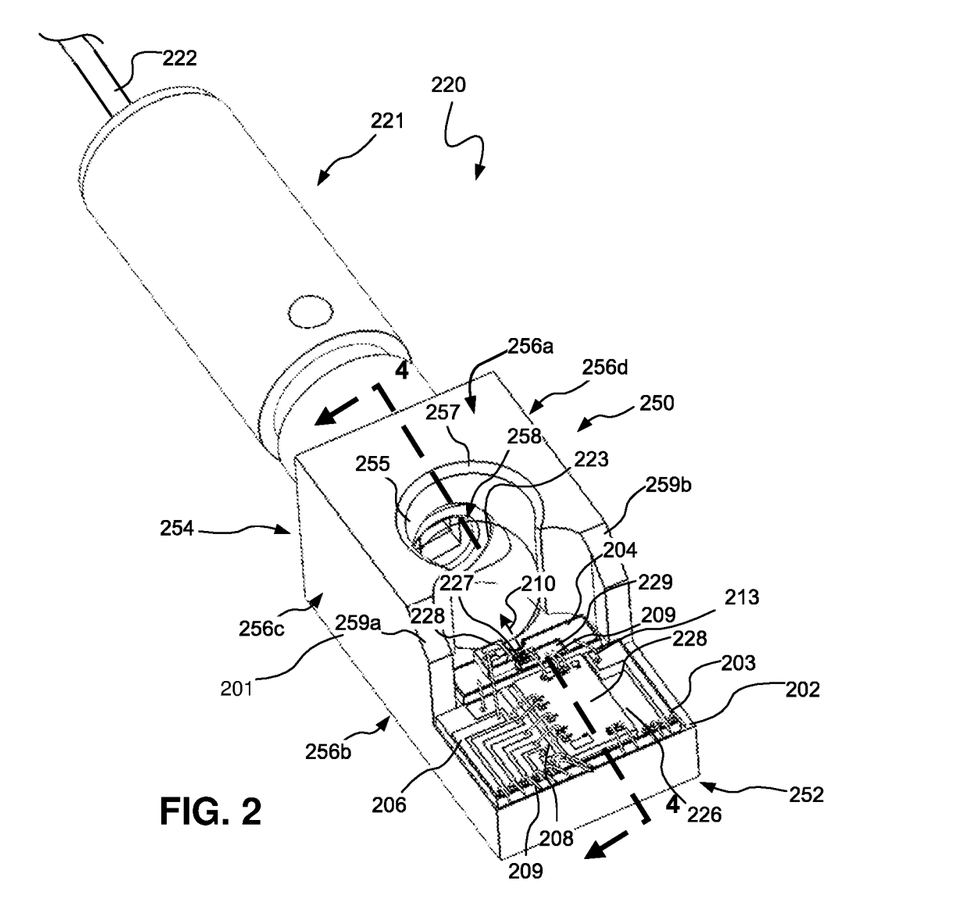
FIG. 2 is a perspective view of a coaxial transmitter optical subassembly (TOSA) with a side-by-side laser and monitor photodiode arrangement, consistent with an embodiment of the present disclosure.

Referring now to FIG. 2, an embodiment of a coaxial TOSA 220 with side-by-side laser diode and monitor photodiode, which may be used in the optical transceivers 100, 100', is described in greater detail. The coaxial TOSA 220 may also be generally referred to herein as a light engine or light engine package. This embodiment of the coaxial TOSA 220 includes a base 201 (or body 201) having a generally cuboid shape. The base 201 may comprise any material that provides suitable thermal conductivity, such as copper, aluminum, or any metal/alloy having a desired thermal conductivity. The base 201 may be formed from a single piece to ensure optimal thermal conductivity, or may be formed from multiple pieces of a same or different material.

Figure 3:
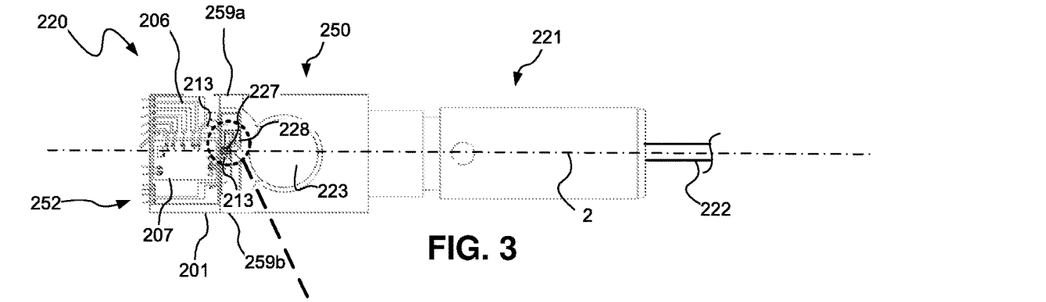
FIG. 3 is a top plan view of the coaxial TOSA of FIG. 2, in accordance with an embodiment of the present disclosure.

The base 201 includes an electrical connecting end 252 (or electrical coupling end 252) opposite an optical coupling end 254, which are disposed along a longitudinal axis 2 (FIG. 3). An optical coupling receptacle 221 extends from the optical coupling end 254. The laser package 250 contains at least a diode laser 227, monitor photodiode 228, and the ball lens 223 for optically coupling the laser 227 to a waveguide in the receptacle 221, such as the respective transmit optical fiber 222 or a separate intermediate optical fiber segment.

The laser package 250 further includes a laser diode driving (LDD) mounting section proximate the electrical connecting end 252 and a laser mounting section proximate the optical coupling end 254. A lens holder cavity 255 in the ball lens holder section receives the ball lens 223 and is dimensioned to position the ball lens 223 in substantial alignment with the diode laser 227 for optically coupling the laser output from diode laser 227 into the optical waveguide in the optical fiber coupling receptacle 221 (e.g., into the optical fiber 222 or into a separate intermediate optical fiber segment). The ball lens 223 is in substantial alignment with the diode laser 227 when the ball lens 223 focuses the laser light into the optical waveguide with a desired coupling efficiency. In one example, the coupling efficiency may be in the range of 15-20%. The ball lens 223 thus allows optical coupling with a lower coupling efficiency for lower power output applications without having to redesign the laser and without having to increase the size of the laser package.

Figure 4:
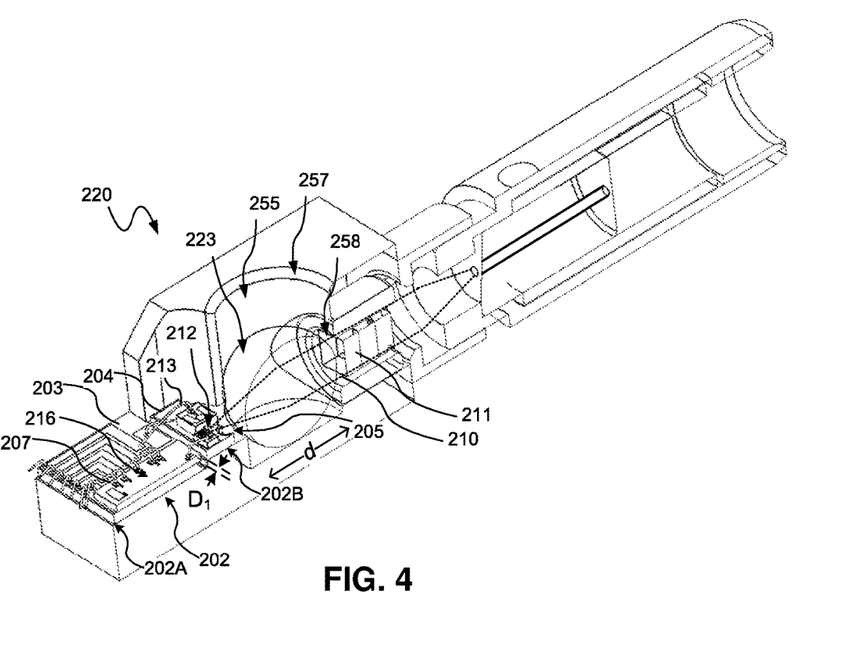
FIG. 4 is a cross-sectional view of the coaxial TOSA of FIG. 2A taken along the line 4-4, in accordance with an embodiment of the present disclosure.

The LDD mounting section and laser mounting section may be provided by mounting surfaces 202A and 202B, respectively, which are more clearly shown in FIG. 4. The first mounting surface 202A couples to an LDD sub-mount 203 and the second mounting surface 202B couples to the laser sub-mount 204, such as shown. The LDD and laser sub-mounts 203, 204 may couple to respective mounting surfaces via thermal epoxy, for example. The LDD and laser sub-mounts 203, 204 may comprise a printed circuit board (PCB) or other substrate suitable for coupling to electrical components. Note the coaxial TOSA 220 is not necessarily limited to two sub-mounts and may include a single sub-mount for coupling to optical components, e.g., the LDD 207, laser diode 227, and monitor photodiode 228. However, as discussed in more detail below, having at least two sub-mounts allows for thermal isolation between optical components.

The second mounting region 202B may be disposed above the first mounting region 202A at the offset $D_1$ to provide a step/shoulder member in the laser mounting section. The shoulder member may be used as a stop/guide to allow the LDD sub-mount 203 to rest "flush" against a surface of the same to ensure alignment in one embodiment. In other cases, a gap is disposed between the shoulder member and LDD sub-mount 203, e.g., such as shown in FIG. 4. The shoulder member may also be used to elevate the laser sub-mount 204 such that the laser diode 227 is disposed above the LDD 207. At least a portion of the laser diode 227 may therefore be in a horizontal plane which is above a horizontal plane that includes the upper surface 216 of the LDD. Thus, heat which is generated by the LDD 207 and transferred by radiation and/or convection may encounter shoulder member and may not necessarily conduct to the laser diode 227. In other words, the shoulder member and the resulting height of the laser diode 227 relative to LDD 207 may provide thermal insulation from the LDD 207.

Returning to FIG. 2, with additional reference to FIG. 4, the LDD sub-mount 203 includes a plurality of electrical traces 206, and the laser diode driver (LDD) 207 disposed thereon. The LDD 207 may be coupled to one end of the plurality of electrical traces via, for example, wire bonding via electrical leads/wires 208 or other suitable interconnect.

A second end of the electrical traces 206 may couple to the transmit connecting circuit 104 via wire bonding using electrical leads/wires 209, for example. The position of the electrical traces 206 may advantageously allow the coaxial TOSA 220 to directly couple to the transit connecting circuit 104.

Continuing on, the mounting surface 202B may be disposed within a cavity defined by walls of the base 201, e.g., walls 259a, 259b. Thus, the laser sub-mount 204 may be at least partially surrounded by the walls extending from the base 201 to form a partially-enclosed region for directing light from laser diode 227 into the ball lens 223. The laser sub-mount 204 includes the laser diode 227 and monitor photodiode 228 mounted thereon. The laser diode 227 may comprise, for example, an edge-emitting light emitting diode (ELED) with a light emitting surface configured to emit a light beam along a path generally indicated by light 210 towards the ball lens 223. The monitor photodiode package 228 may comprise, for example, an edge photodiode detector (edge PD).

As discussed in further detail below with reference to FIGS. 3 and 3A, the monitor photodiode package 228 may be disposed in a side-by-side arrangement with the laser diode 227 such that a photo-sensitive region 212 (which may also be referred to as a sensor region/surface) of the monitor photodiode package 228 is disposed in, or within suitable proximity of, the light beam emitted by the laser diode 227 for monitoring purposes. This advantageously allows the monitor photodiode package 228 to directly optically couple with the laser diode 227 without having to necessarily provide light indirectly, e.g., by reflecting the light into monitor photodiode package 228 via a surface of the coaxial TOSA 220 or a mirror device.

Continuing with FIG. 2 with additional reference to FIG. 4, the laser sub-mount 204 may include a notch 205 (or cut-out 205) adjacent a light emitting surface of the laser diode 227 to avoid impinging on a light beam projected from the laser diode 227.

The base 201 of the laser package 250 may have a length in a range of about 4 to 5 mm and a width in a range of about 2 to 2.5 mm, for example. In the illustrated embodiment, the lens holder cavity 255 has a circular perimeter with a diameter (d) in a range of about 1.4 to 1.6 mm to position the ball lens 223, which has a diameter in a range of about 1.4 to 1.6 mm. More specifically, the lens holder cavity 255 has a diameter of 1.51 mm to position a ball lens 223 having a diameter of 1.5 mm. The depth of the lens holder cavity 255 may be at least about 2.15 mm. The circular perimeter of the ball lens holder cavity 255 thus contacts a corresponding circular perimeter on the ball lens 223 with a corresponding diameter. In general, a smaller diameter lens holder cavity 255 will hold the ball lens 223 in a higher position relative to the laser 227.

In the illustrated embodiment of FIG. 4, the ball lens holder cavity 255 is a cylindrical recess with a depth sufficient to hold the ball lens 223 in a desired position. In other embodiments, the ball lens holder cavity 255 may be a conical recess or may be a hole through the base 201. Other shapes and configurations of the lens holder cavity are also within the scope of the present disclosure. In other embodiments, inserts (e.g., a concave insert, a conical insert or a hollow cylindrical insert) may also be used in the ball lens holder cavity 255, for example, to adjust the position of the ball lens 223 relative to the laser 227.

In the illustrated embodiment, the laser package 250 also includes an arcuate wall 257 extending from the base 201 proximate the optical coupling end 254 for receiving the ball lens 223, thereby further defining the ball lens holder section. The arcuate wall 257 may have a radius of curvature that corresponds to the radius of the ball lens 223. The arcuate wall 257 defines an optical output aperture 258 that allows laser light (e.g., shown as beam direction 210) to pass through for optical coupling (e.g., see FIG. 4). Optics, such as an optical isolator 211, may also be located within the aperture 258, which is shown more clearly in FIG. 4. The illustrated embodiment of the laser package 250 further includes lens holder section side walls 259a, 259b extending from the arcuate wall 257 along sides of the ball holder section. The arcuate wall 257 and the side walls 259a, 259b thus form a ball lens holder section with a generally omega-shaped ($\Omega$) cross section, as shown in FIG. 3. The lens holder cavity 255 may be located relative to the arcuate wall 257 such that the ball lens 223 is positioned against the arcuate wall 257.

The optical coupling receptacle 221 extends from the optical coupling end 254 of the laser package 250 for optically coupling the laser diode 227 to the optical fiber 222. The optical fiber 222 may include, for example, a fiber-terminating ferrule (not shown) at the end of the optical fiber 222, which is received in the receptacle 221 to align an end of the optical fiber 222 with laser light being focused by the ball lens 223.

In the illustrated embodiment, the walls 259a, 259b extending from the base 201 to define a laser compartment may provide thermal shielding for the laser 227. The laser sub-mount 204 includes conductive paths 229 (or electrical terminals 229) for providing the electrical connection between the laser 227 and the LDD 207, for example, by wire bonding from the conductive paths 229 with electrical leads or wires 213 (see FIGS. 3 and 4). The electrical leads or wires 213 electrically connected to the conductive paths 229 on the laser sub-mount 204 generally extend towards the electrical connecting end 252. As shown in FIG. 3, the LDD 207, the laser 227, the lens 223, the optical coupling receptacle 221, and the optical fiber 222 are generally positioned coaxially along or substantially parallel to a longitudinal axis 2, thereby providing the coaxial configuration of the coaxial TOSA 220.

A monitor photodiode 228 may also be mounted on the laser sub-mount 226, for example, to monitor light emitted from the laser diode 227. As shown in FIG. 3 and FIG. 3A, the monitor photodiode 228 may be positioned side-by-side with the laser diode 227 on the laser sub-mount 204. For example, the monitor photodiode 228 may be disposed at a distance of $D_4$ from that of the laser diode 227, with the distance $D_4$ being about 20 microns or less. The monitor photodiode 228 may be offset from the laser diode 227 by a distance of $D_5$ such that the PD sensor region 212 is disposed at an angle $\theta$ relative to the light emitting surface 214, with the angle $\theta$ being about 90 degrees and distance $D_5$ measuring about 250 microns. Although the PD sensor region 212 is shown as extending perpendicular relative to the light emitting surface 214 of the laser diode 227 (and by extension in parallel with the longitudinal axis 2), this disclosure is not limited in this regard. The monitor photodiode 228, and in particular, the PD sensor region 212, may extend at an angle $\theta$ greater than or less than 90 degrees depending on the position of the monitor photodiode 228. In any event, the PD sensor region 212 may be disposed within, or in close proximity of, the light cone/beam 215 emitted by the laser diode 227. Thus, a suitable percentage of light, e.g., at least 1%, emitted by the laser diode 227 may be directly received by the PD sensor region 212.

Figure 3A:
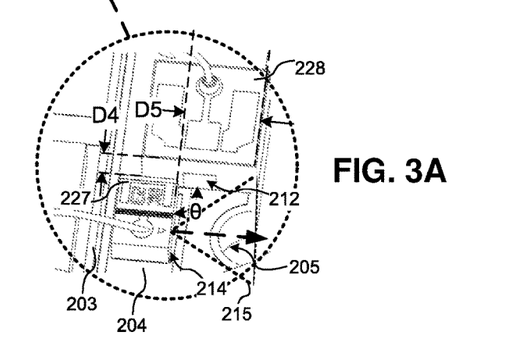
FIG. 3A is an enlarged portion of the coaxial TOSA of FIG. 2 showing a laser sub-mount having a monitor photodiode disposed proximate to a laser diode, in accordance with an embodiment of the present disclosure.

Continuing with FIGS. 3 and 3A, and in some embodiments, the coaxial TOSA may further include one or more temperature control devices (not shown) within or on the laser package 250, e.g., mounted to the laser sub-mount 204 or the LDD sub-mount 203. The temperature control devices may include a heater, such as a resistive heater, located adjacent the diode laser 227 to provide independent control of the temperature of the diode laser 227 and thus the wavelength of the emitted laser light. The laser package 250 facilitates this independent temperature control of each laser 227 by preventing heat from outside of the package 250 from affecting the laser 227. Additionally, or alternatively, the temperature control device may include a micro thermoelectric cooler (TEC) within the laser package 250 to provide the individual and independent temperature control of the laser 227. A TEC may also be used outside of the laser package 250 by thermally coupling to an outside surface of the laser package 250.

In the illustrated embodiment, the laser package 250 is a cuboid type TO package having a generally cuboid or parallelepiped outer shape to provide heat dissipation and/or thermal shielding. The cuboid type TO laser package 250 includes at least one substantially flat outer surface substantially orthogonal to the electrical connecting end 252 and the optical coupling end 254 for contacting another substantially flat surface to facilitate heat transfer. In the illustrated embodiment, top, bottom, and side surfaces 256a-d are substantially flat (FIG. 2), which allows multiple cuboid type TO laser packages 250 to be stacked in a transceiver housing. In this embodiment, the bottom surface 256b provides the greatest surface area for heat transfer. Other shapes and configurations for the laser package are also possible and within the scope of the present disclosure. Although the illustrated embodiment shows the laser package 250 with a particular shape, other shapes and configurations are also possible. In other embodiments, for example, the cuboid type TO laser package 250 may be closed at the top (e.g., the side opposite the base 201).

The laser package 250 may be made of a thermally conductive material having a thermal conductivity greater than 60 W/(m·K) and more specifically greater than 80 W/(m·K) and, for example, about 160 W/(m·K). The laser package 250 may be made, for example, from copper tungsten and may also be gold plated, for example, to facilitate soldering. In some embodiments, the laser package 250 may be made from a nickel-cobalt ferrous alloy such as the type sold under the trademark KOVAR. Other thermally conductive materials may also be used.

The flat surfaces of the laser package 250 advantageously provide for increased surface area contact between the package 250 and other packages or the transceiver housing. This increased surface area contact improves thermal transfer or heat conduction, and thus facilitates heat dissipation even in a smaller package design compared to traditional cylindrical type TO packages. In a conventional cylindrical type TO can package, the flat surfaces at the ends of the package cannot effectively be used for thermal transfer because it would interfere with the electrical connections and optical couplings made at these ends of the cylindrical type TO can package. The laser package 250 provides the electrical connections and optical couplings at the ends in a coaxial configuration while also providing flat surfaces for thermal coupling and for stacking in a compact arrangement.

Figure 5:
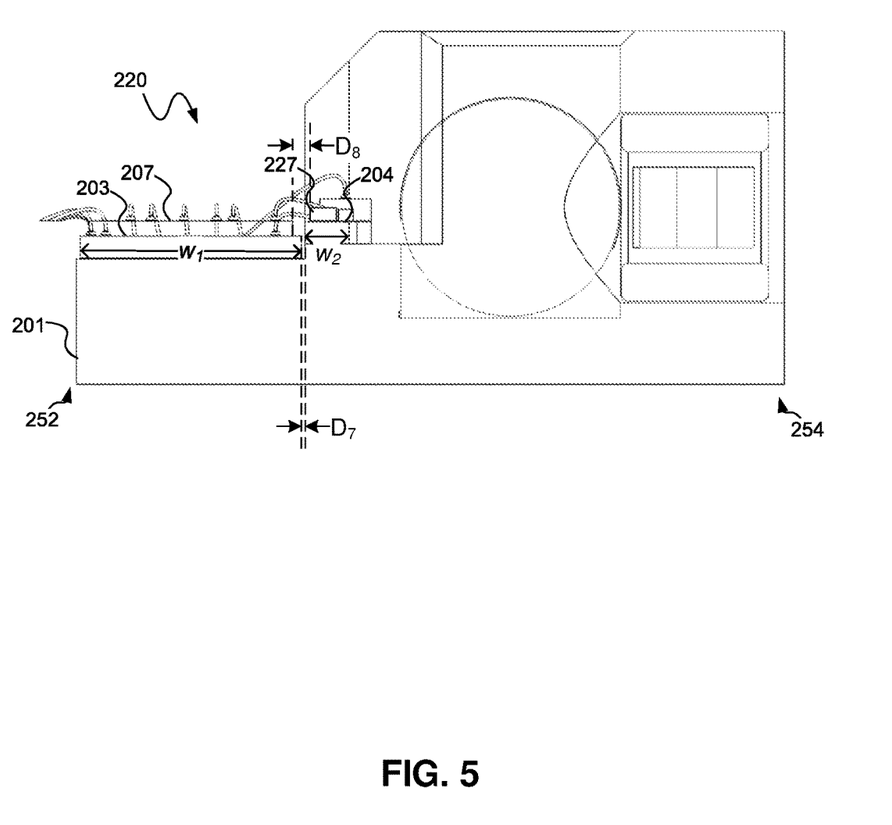
FIG. 5 is another cross-sectional view of the coaxial TOSA of FIG. 2A taken along the line 4-4.

Turning to FIG. 5, another cross-sectional view of the coaxial TOSA 220 is shown take along the line 4-4 of FIG. 2, in accordance with an embodiment of the present disclosure. As shown, the LDD sub-mount 203 may be disposed at a distance $D_7$ from the laser sub-mount 204, with distance $D_7$ being in a range of about 0 microns to 5 microns, for example. The LDD 207 may be disposed at a distance of $D_8$ from the laser diode 227, with the distance $D_8$ being in a range of about 5 to 20 microns, for examples. The LDD 207 may be thermally isolated from the laser 227, and vice-versa, based on the gap formed therebetween. Each of the LDD 207 and the laser 227 may therefore conduct directly on to different sections of the base 201 without directly conducting heat on to each other. The gap may also be sized to provide a relatively short path for electrical coupling, e.g., via wire bonding, to mitigate degradation of RF signals provided by the LDD 207 to the laser 227. The width $W_1$ of the LDD sub-mount 203 may measure about 1.5 mm, and with the width $W_2$ of the laser sub-mount 204 may measure about 0.45 mm, although other embodiments are within the scope of this disclosure.

Accordingly, the coaxial TOSA, consistent with embodiments described herein, includes separate laser and LDD sub-mounts to prevent thermal interference therebetween. In addition, some embodiments includes a photodiode in a side-by-side configuration with an associated laser diode to save sub-mount space and to advantageously allow for an LDD to be disposed in close proximity with the laser diode for direct coupling purposes. In addition, a coaxial TOSA consistent with embodiments described herein includes a ball lens held within a relative small laser package for optically coupling a laser. The ball lens allows a lower coupling efficiency for lower power applications without having to redesign the laser or increase the size of the laser package.

Consistent with one aspect of the present disclosure, a coaxial transmitter optical subassembly (TOSA) is disclosed. The TOSA comprising a laser package including a base having an electrical connecting end and an optical coupling end opposite the electrical connecting end, a laser diode driver (LDD) mounting section proximate the electrical connecting end of the base and a laser mounting section proximate the optical coupling end of the base; and a laser diode and a monitor photodiode disposed on the laser mounting section, wherein the monitor photodiode is disposed in a side-by-side arrangement with the laser diode such that a sensor region of the monitor photodiode is disposed within, or in close proximity of, a light emitting surface of the laser diode for direct optical coupling with the laser diode.

Consistent with another aspect of the present disclosure a transceiver module is disclosed. The optical transceiver module comprising a transceiver housing, a plurality of coaxial TOSAs located in the transceiver housing for transmitting optical signals at different channel wavelengths, each of the plurality of coaxial TOSAs comprising a laser package including a base having an electrical connecting end and an optical coupling end opposite the electrical connecting end, a laser diode driver (LDD) mounting section proximate the electrical connecting end of the base and a laser mounting section proximate the optical coupling end of the base, and a laser diode and monitor photodiode disposed on the laser mounting section, wherein the monitor photodiode is disposed in a side-by-side arrangement with the laser diode such that a sensor region of the monitor photodiode is disposed within, or in close proximity of, a light emitting surface of the laser diode for direct optical coupling purposes, a multi-channel receiver optical subassembly (ROSA) located in the transceiver housing for receiving optical signals at different channel wavelengths.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A coaxial transmitter optical subassembly (TOSA) comprising:
   a laser package including a base having an electrical connecting end and an optical coupling end opposite the electrical connecting end, a laser diode driver (LDD) mounting section proximate the electrical connecting end of the base and a laser mounting section proximate the optical coupling end of the base; and
   a laser diode and a monitor photodiode disposed on the laser mounting section, wherein the monitor photodiode is disposed in a side-by-side arrangement with the laser diode whereby the monitor photodiode is disposed proximate a surface of the laser diode that extends substantially transverse relative to a light emitting surface of the laser diode such that a sensor region of the monitor photodiode is disposed within, or in close proximity of a light emitting surface of the laser diode for direct optical coupling with the laser diode, and wherein at least one horizontal plane that extends substantially parallel with a surface defining the laser mounting section intersects with the laser diode and the monitor photodiode.

2. The coaxial TOSA of claim 1, further comprising an LDD disposed in the LDD mounting section, wherein the LDD is disposed adjacent to a surface of the laser diode that is opposite of the light emitting surface.

3. The coaxial TOSA of claim 2, wherein the LDD and laser diode are directly electrically coupled.

4. The coaxial TOSA of claim 1, further comprising:
   a ball lens holder section proximate the optical coupling end of the base, the ball lens holder section defining a lens holder cavity; and
   a ball lens positioned within the lens holder cavity of the ball lens holder section, wherein the lens holder cavity is dimensioned such that the ball lens is positioned in substantial alignment with the laser diode for optically coupling a laser output from the laser diode into an optical waveguide at the optical coupling end.

5. The coaxial TOSA of claim 4, wherein the lens holder cavity has a circular perimeter, and wherein a diameter of the lens holder cavity determines a position of the ball lens relative to the laser.

6. The coaxial TOSA of claim 4, wherein the ball lens holder section includes an arcuate end wall extending from the base proximate the optical coupling end, the arcuate end wall being configured to receive the ball lens and defining an optical output aperture.

7. The coaxial TOSA of claim 1, wherein the laser package is a cuboid type TO laser package having a plurality of substantially flat outer surfaces, and wherein the cuboid type TO laser package is made of a thermally conductive material.

8. The coaxial TOSA of claim 7, wherein at least one of the substantially flat outer surfaces is orthogonal to the electrical connecting end and the optical coupling end.

9. The coaxial TOSA of claim 1, further comprising a laser sub-mount disposed in the laser mounting section and an LDD sub-mount disposed in the LDD mounting section, the laser sub-mount being different from the LDD sub-mount, and wherein the LDD sub-mount is thermally isolated from the laser sub-mount such that each of the LDD sub-mount and the laser sub-mount provide different thermal conductive paths to the base for the LDD and laser diode, respectively.

10. The coaxial TOSA of claim 9, further comprising a gap between the LDD sub-mount and the laser sub-mount to provide thermal isolation.

11. The coaxial TOSA of claim 9, further comprising a shoulder member formed by the base within the laser mounting section, and wherein at least a portion of the laser diode is disposed in a horizontal plane that is above a horizontal plane that includes a top outer surface of the LDD.

12. An optical transceiver module comprising:
   a transceiver housing;
   a plurality of coaxial TOSAs located in the transceiver housing for transmitting optical signals at different channel wavelengths, each of the plurality of coaxial TOSAs comprising:
      a laser package including a base having an electrical connecting end and an optical coupling end opposite the electrical connecting end, a laser diode driver (LDD) mounting section proximate the electrical connecting end of the base and a laser mounting section proximate the optical coupling end of the base; and
      a laser diode and monitor photodiode disposed on a same surface that defines laser mounting section, wherein the monitor photodiode is disposed in a side-by-side arrangement with the laser diode whereby the monitor photodiode is disposed proximate a surface of the laser diode that extends substantially transverse relative to a light emitting surface of the laser diode such that a sensor region of the monitor photodiode is disposed within, or in close proximity of a light emitting surface of the laser diode for direct optical coupling purposes, and wherein the laser diode and monitor photodiode are disposed within a horizontal plane that extends substantially parallel with the surface defining the laser mounting section and that extends through the light emitting surface of the laser diode and the sensor region of the monitor photodiode,
   a multi-channel receiver optical subassembly (ROSA) located in the transceiver housing for receiving optical signals at different channel wavelengths.

13. The optical transceiver module of claim 12, further comprising a LDD disposed in the LDD mounting section of each of the plurality of coaxial TOSAs, wherein the LDD is disposed adjacent a surface of the laser diode that is opposite of the light emitting surface.

14. The optical transceiver module of claim 13, wherein the LDD and laser diode are directly electrically coupled in each of the plurality of coaxial TOSAs.

15. The optical transceiver module of claim 12, further comprising a laser sub-mount disposed in the laser mounting section and an LDD sub-mount disposed in the LDD mounting section of each of the plurality of coaxial TOSAs, the laser sub-mount being different from the LDD sub-mount, and wherein the LDD sub-mount is thermally isolated from the laser sub-mount such that each of the LDD sub-mount and the laser sub-mount for each of the plurality of coaxial TOSAs provide different thermal conductive paths to the base for the LDD and laser diode, respectively.

16. The optical transceiver module of claim 15, further comprising a gap between the LDD sub-mount and the laser sub-mount to provide thermal isolation.

17. The optical transceiver module of claim 15, further comprising a shoulder member formed by the base within the laser mounting section of each of the plurality of coaxial TOSAs, and wherein at least a portion of the laser diode is disposed in a horizontal plane that is above a horizontal plane that includes a top outer surface of the LDD.

18. The coaxial TOSA of claim 1, wherein the laser diode and the monitor photodiode are mounted on the surface defining the laser mounting section.

19. The coaxial TOSA of claim 18, wherein the surface defining the laser mounting section is provided by a sub-mount.

20. The coaxial TOSA of claim 18, further comprising an LDD mounted to the LDD mounting section via a LDD submount, the LDD being electrically coupled to the laser diode via wire bonds.

\* \* \* \* \*